United States Patent
Gronvall

(10) Patent No.: US 11,745,974 B2
(45) Date of Patent: Sep. 5, 2023

(54) WOUND CABLE HOLDER WITH IMPROVED CABLE DEPLOYMENT CONTROL

(71) Applicant: CommScope Technologies LLC, Hickory, NC (US)

(72) Inventor: Erik J. Gronvall, Bloomington, MN (US)

(73) Assignee: CommScope Technologies LLC, Hickory, NC (US)

( * ) Notice: Subject to any disclaimer, the term of this patent is extended or adjusted under 35 U.S.C. 154(b) by 563 days.

(21) Appl. No.: 16/869,669

(22) Filed: May 8, 2020

(65) Prior Publication Data

US 2020/0354184 A1 Nov. 12, 2020

Related U.S. Application Data

(60) Provisional application No. 62/845,970, filed on May 10, 2019.

(51) Int. Cl.
*B65H 57/18* (2006.01)
*B65H 55/04* (2006.01)

(52) U.S. Cl.
CPC ............ *B65H 57/18* (2013.01); *B65H 55/04* (2013.01); *B65H 2701/32* (2013.01)

(58) Field of Classification Search
CPC .. G02B 6/4457; G02B 6/4452; H05K 7/1491; B65H 57/18; B65H 55/04; B65H 2701/32
See application file for complete search history.

(56) References Cited

U.S. PATENT DOCUMENTS

| | | | | |
|---|---|---|---|---|
| 3,474,985 A * | 10/1969 | Cromer | ................. | B65H 75/38 414/667 |
| 4,884,863 A * | 12/1989 | Throckmorton | ...... | G02B 6/4441 385/135 |
| 5,448,670 A * | 9/1995 | Blew | .................... | G02B 6/4422 385/100 |
| 7,599,598 B2 * | 10/2009 | Gniadek | .............. | G02B 6/4457 385/100 |
| 8,494,333 B2 * | 7/2013 | Kowalczyk | ............ | G02B 6/445 385/135 |
| 8,731,363 B2 * | 5/2014 | Cairns | .................. | G02B 6/4401 242/591 |
| 9,715,068 B2 * | 7/2017 | Cairns | .................. | G02B 6/3888 |
| 10,371,914 B2 * | 8/2019 | Coan | .................... | G02B 6/4457 |
| 10,545,305 B2 * | 1/2020 | Leeman | ............... | G02B 6/4454 |
| 10,962,730 B2 * | 3/2021 | Hill | .......................... | H04Q 1/13 |

(Continued)

OTHER PUBLICATIONS

"SmartRoute Infinity Panel Installation Manual," Clearfield, Manual 020636 REV-A, Mar. 2019, 15 pages.

(Continued)

*Primary Examiner* — William A. Rivera
(74) *Attorney, Agent, or Firm* — Merchant & Gould P.C.

(57) ABSTRACT

Holders for wound cables. The holders include retention features to control the rate at which cable windings are unwound during cable deployment. In some examples, the cable holder includes a pair of spaced apart spools and the cable is wound in windings configured as figure-8's. In some examples, the retention features include flexibly resilient fingers positioned to contact the windings at one or more retention points positioned at a deployment end of the holder.

17 Claims, 4 Drawing Sheets

(56) References Cited

U.S. PATENT DOCUMENTS

| | | | |
|---|---|---|---|
| 11,160,187 B1* | 10/2021 | Jin | H04B 10/40 |
| 2006/0183362 A1* | 8/2006 | Mullaney | G02B 6/4457 |
| | | | 439/164 |
| 2014/0061356 A1* | 3/2014 | Ott | B65H 54/10 |
| | | | 242/472.7 |
| 2021/0174989 A1* | 6/2021 | Bran De León | H01B 9/005 |

OTHER PUBLICATIONS

"SmartRoute Infinity Panel 1RU Panel," Clearfield, Retrieved Apr. 30, 2019 from www.SeaClearfield.com. V.04.19, 2 pages.

* cited by examiner

WOUND CABLE HOLDER WITH IMPROVED CABLE DEPLOYMENT CONTROL

CROSS-REFERENCE TO RELATED APPLICATION

This application claims priority to U.S. Provisional Patent Application Ser. No. 62/845,970 filed May 10, 2019, the contents of which application are hereby incorporated by reference in their entirety.

BACKGROUND

Cables carrying signal conduits, such as optical fibers and electrical wires, are common in many applications, such as telecommunications networks. Excess length of a cable is often stored in a wound configuration for later deployment when needed.

SUMMARY

In general terms, the present disclosure is directed to a holder configured to hold windings of a cable and having at least one retainer positioned with respect to the holder to control unwinding of the cable windings.

In some examples, the at least one retainer includes a resiliently flexible finger or a pair of resiliently flexible fingers, the finger or fingers having one free end and an opposite end attached to the housing.

In some examples, the finger or fingers and/or the holder include couplers for coupling the finger(s) to the holder and decoupling the finger(s) from the holder.

In some examples, the finger(s) extend(s) from their attached ends in opposite directions.

In some examples, the holder includes a spool.

In some examples, the holder includes a pair of spaced apart spools.

In some examples, the at least one retainer is made from a polymeric and/or metallic material.

In some examples, the at least one retainer is made from the same material as the component of the cable winding holder to which the at least one retainer is attached.

In some examples, the at least one retainer includes a flared portion of the spool, or a flared portion of each of the pair of spaced apart spools.

In some examples, the holder includes a housing that houses the spool(s).

In some examples, the spool(s) is/are movable relative to the housing along a cable deployment axis.

In some examples, the cable is connected to a patch panel of adapters mounted in the housing.

In some examples, the patch panel is movable with the spool(s) relative to the housing along the cable deployment axis.

In some examples, the housing is mountable to a rack or to a frame.

In some examples, the cable is connectorized at one end or at two ends of the cable.

In some examples, the windings are loops.

In some examples, the windings have figure 8 configurations.

In some examples, a reference line that is perpendicular to the deployment axis and bisects a space between the spaced apart spools is crossed by the finger(s).

In some examples, a reference line that is perpendicular to the deployment axis and intersects radial centers of the first and second spaced apart spools is crossed by the finger(s).

According to certain aspects of the present disclosure, a wound cable holder includes a holder body that defines a cable deployment end, and a cable winding retainer positioned at the cable deployment end.

In some examples, the retainer includes a flared portion of a spool.

In some examples, the retainer includes one or more flexibly resilient fingers.

According to further aspects of the present disclosure, a wound cable holder comprises: a holder body defining a cable deployment end and comprising a pair of spaced apart spools, the spools having central axes that are parallel to a cable deployment axis defined by the holder body, the holder further comprising one or more cable winding retainers positioned at the cable deployment end. In some examples, the cable deployment end coincides with cable deployment ends of the spools. In some examples, the one or more retainers includes one or more flexibly resilient fingers. The one or more retainer(s) can be coupled to the deployment ends of the spool(s) and/or a housing that houses the spools. In some examples, the one or more retainers include(s) flared end portions of the spools.

According to further aspects of the present disclosure, a wound cable holder is provided, the holder comprising: a holder body supporting a plurality of cable windings of a cable, the cable windings being positioned along a cable deployment axis defined by the holder body, the cable deployment axis defining a cable deployment direction, the holder further defining a cable deployment end, the holder further comprising a cable winding retainer positioned at the cable deployment end, the cable winding retainer being positioned and configured to successively contact the cable windings as the cable is deployed from the holder body and provide a resistive force against each successive cable winding in a direction that is opposite to the cable deployment direction.

According to further aspects of the present disclosure, a wound cable holder, comprises: a housing; a holder body defining a cable deployment end, the holder body including a pair of spaced apart spools supported within the housing, the spools having central axes that are parallel to a cable deployment axis defined by the holder body, the housing supporting the holder body and a patch panel of optical fiber adapters; and a pair of cable winding retainers positioned at the cable deployment end and further positioned and configured to contact and apply a resistive force against a cable winding when a cable is deployed from the holder body.

According to further aspects of the present disclosure, a method comprises: providing a wound cable holder, the wound cable holder including: a holder body supporting a plurality of cable windings of a cable, the cable windings being positioned along a cable deployment axis defined by the holder body, the cable deployment axis defining a cable deployment direction, the holder body further defining a cable deployment end; and a cable winding retainer positioned at the cable deployment end, the cable winding retainer being positioned and configured to successively contact the cable windings as the cable is deployed from the holder body and provide a resistive force against each successive cable winding in a direction that is opposite to the cable deployment direction; and pulling the cable at least partially in the cable deployment direction such that at least a first of the cable windings unwinds, such that a second of the cable windings adjacent to the first winding engages the cable winding retainer, and such that unwinding of the second cable winding is resisted by the cable winding retainer.

According to further aspects of the present disclosure, a method comprises providing a wound cable holder, the wound cable holder including: a holder body supporting a plurality of cable windings of a cable, the cable windings being positioned along a cable deployment axis defined by the holder body, the cable deployment axis defining a cable deployment direction, the holder body further defining a cable deployment end; and a cable winding retainer positioned at the cable deployment end, the cable winding retainer being positioned and configured to successively contact the cable windings as the cable is deployed from the holder body and provide a resistive force against each successive cable winding in a direction that is opposite to the cable deployment direction; moving the cable winding retainer from a first position to a second position relative to the holder body; and subsequent to the moving, winding a portion of the cable onto the holder body.

A variety of additional aspects will be set forth in the description that follows. The aspects relate to individual features and to combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

The following drawings are illustrative of particular embodiments of the present disclosure and therefore do not limit the scope of the present disclosure. The drawings are not to scale and are intended for use in conjunction with the explanations in the following detailed description. Embodiments of the present disclosure will hereinafter be described in conjunction with the appended drawings, wherein like numerals denote like elements.

DETAILED DESCRIPTION

Figure 1:
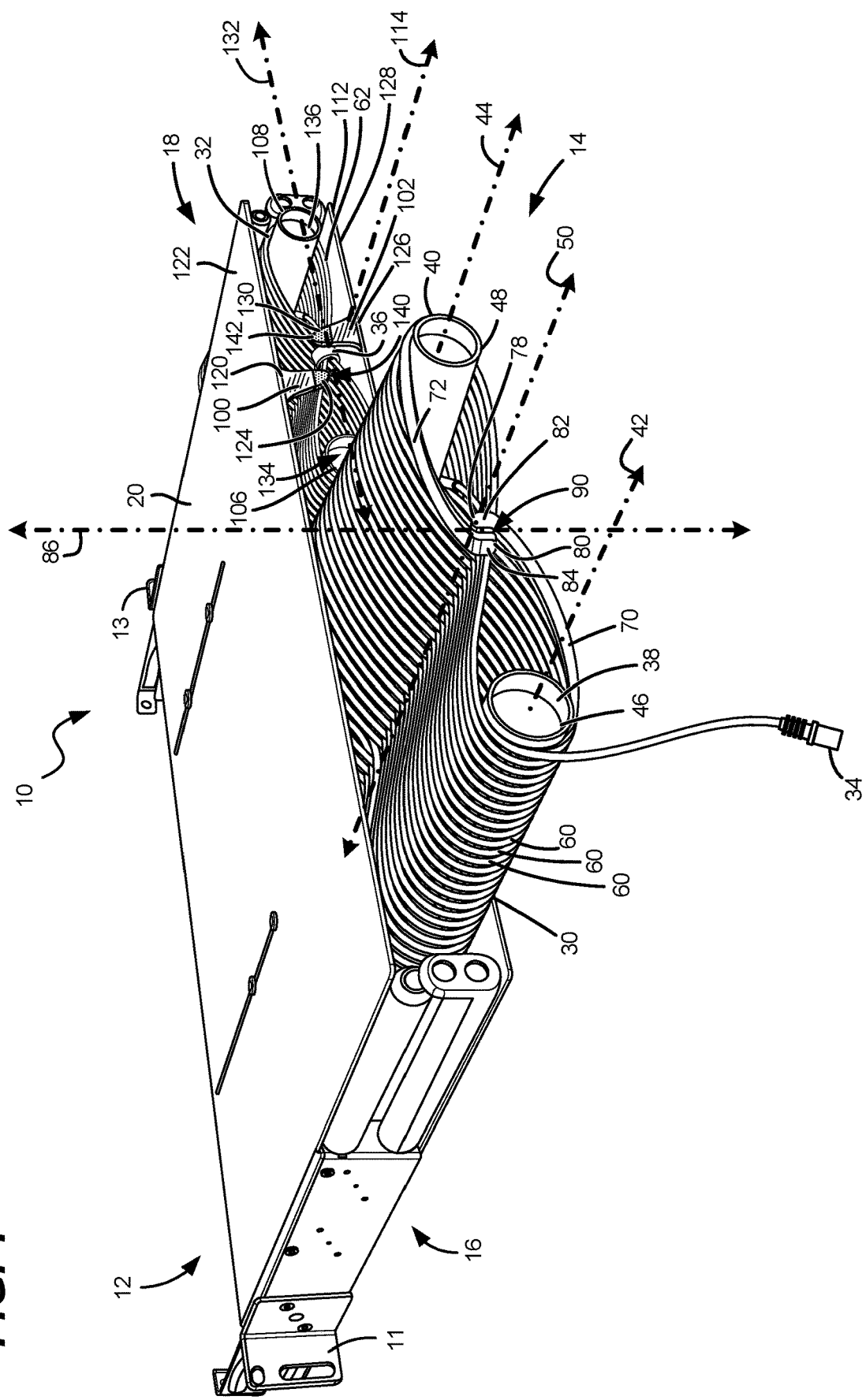
FIG. 1 is a rear perspective view of a telecommunications shelf including example cable winding holders and winding retainers in accordance with the present disclosure, a first of the holders being in a first configuration.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Figure 2:
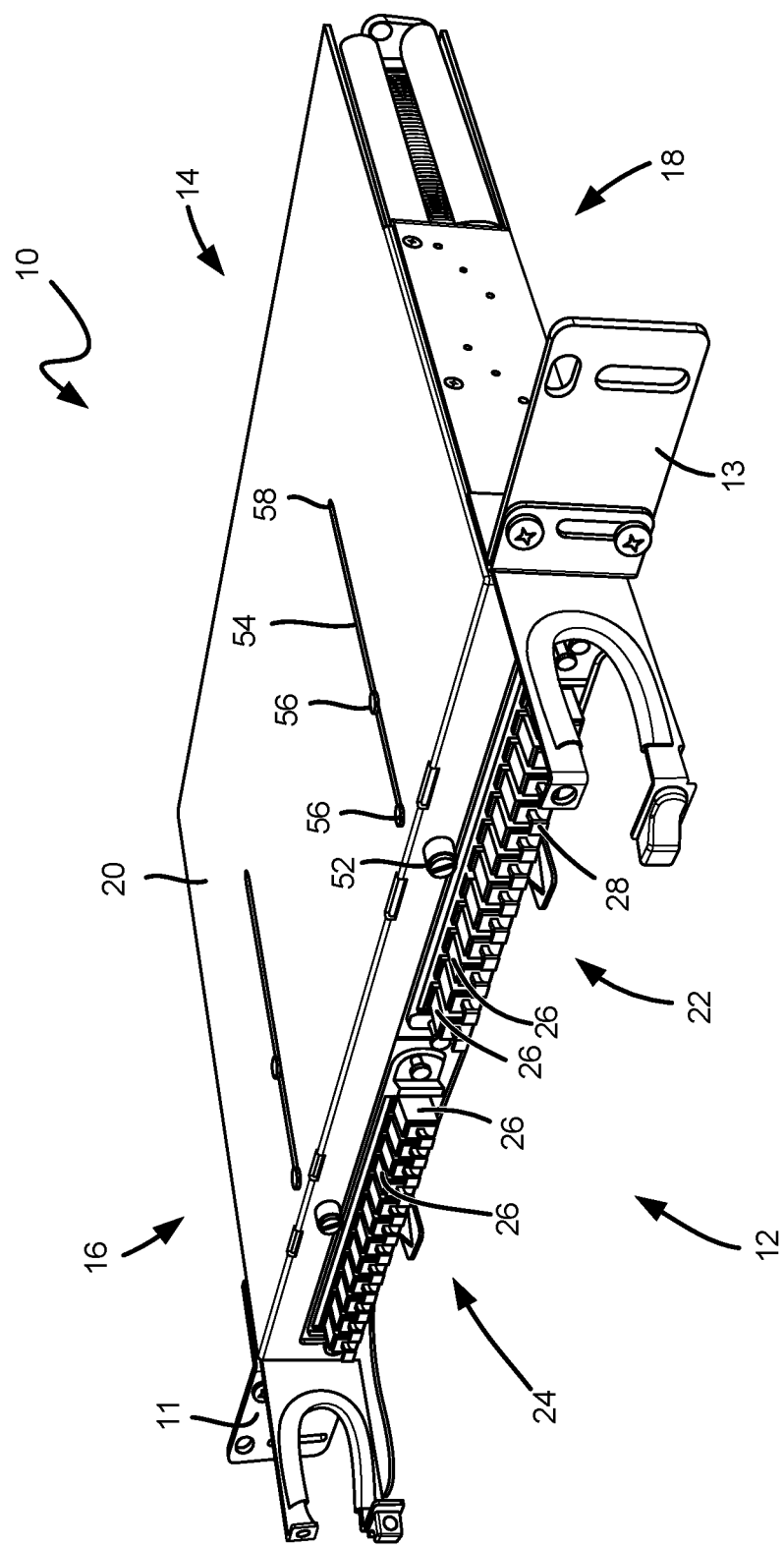
FIG. 2 is a front perspective view of the telecommunications shelf of FIG. 1, with the first of the holders being in a second configuration.
Figure 3:
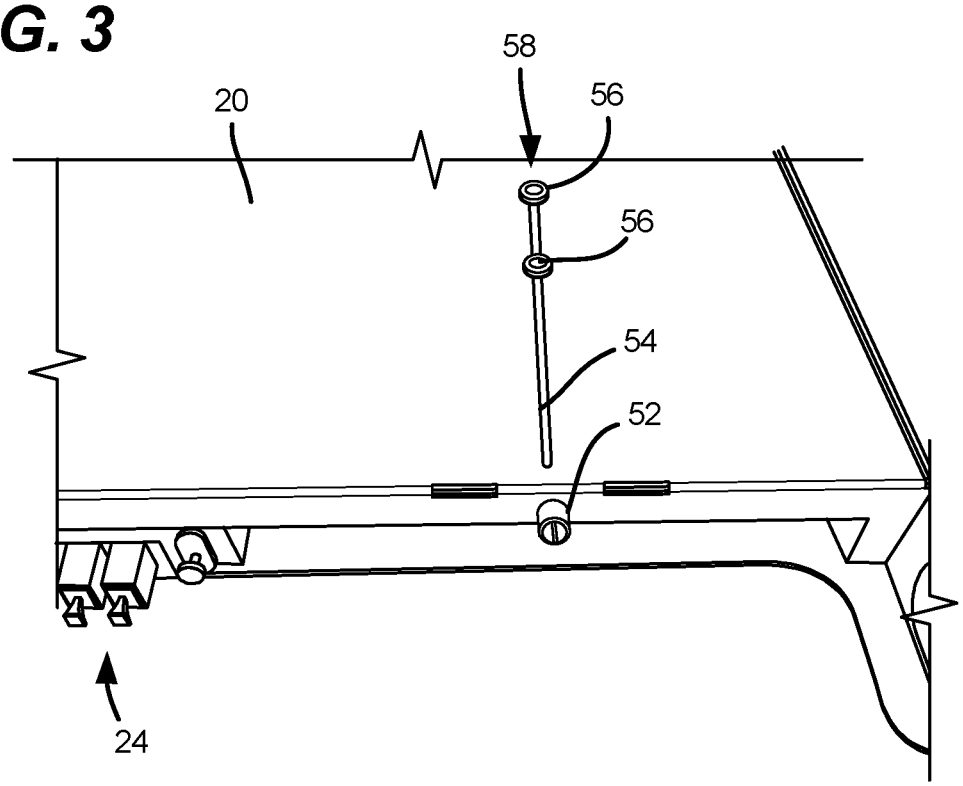
FIG. 3 is front perspective view of a portion of the telecommunications shelf of FIG. 1, with the first of the holders being in the first configuration.

Referring to FIGS. 1-2, a telecommunications shelf 10 generally has a front 12, a back or rear 14, and opposite sides 16 and 18. The shelf 10 includes a housing 20 that supports a pair of fiber optic patch panels 22 and 24. The patch panels 22, 24 support adapters 26 configured to receive first and second optical fiber connectors (not shown). The adapters 26 include front and back receptacles for holding a pair of connectors that are optically coupled. In the example shown, the front receptacles are plugged by dust caps 28 to minimize ingress of contaminants. When an active connection is desired through one of the adapters 26, the dust cap 28 can be removed from the corresponding receptacle and the optical fiber connector inserted.

Brackets 11, 13 are mounted to the sides of the housing 20. The brackets 11, 13 can be used to mount the shelf 10 to a rack or other telecommunications equipment.

In this example, each of the patch panels 22, 24 includes 12 single fiber to single fiber adapters 26. The back receptacles of the adapters 26 of each of the panels 22, 24 hold 12 single fiber connectors. The fibers that are connectorized with the connectors received in the rear receptacles of the adapters 26 of the panel 22 extend from a multi-fiber cable 30. The fibers that are connectorized with the connectors received in the rear receptacles of the adapters 26 of the panel 24 extend from a multi-fiber cable 32. Each of the multi-fiber cables 30, 32 is terminated by a multi-fiber connector (e.g., a MPO connector). For example, the cable 30 is terminated by a multi-fiber connector 34. With respect to a the cable 32, a wrap fastener 36 fastens its multi-fiber connector to a portion of the cable 32. When it is time to deploy the cable 32, the wrap fastener 36 can be removed.

Each of the cables 30, 32 is stored in windings on a cable holder. The cable holder for the cable 30 includes the housing 20 and a holder body having a pair of spaced apart spools 38 and 40. The spools 38, 40 are defined by central spool axes 42, 44, respectively, extending between front ends (not shown) and back ends 46, 48 along the spool axes 42, 44.

The spool axes 42, 44 run parallel to a cable deployment axis 50, and the spool axes 42, 44 and the cable deployment axis 50 are parallel to the front to back direction of the shelf 10.

The spools 38, 40 and the patch panel 22 are coupled to each other as an assembly that is moveable relative to the housing 20. In particular, the assembly can be moved parallel to the cable deployment axis 50 rearwards to expose rear portions of the spools 38, 40 in order to wind up a length of the cable 30 onto the spools, and frontwards to return the patch panel 22 to the front of the housing 20 so that the adapters 26 can be accessed from the front of the shelf 10. A fastener 52 can be used to lock the patch panel 22 to the housing in the configuration shown in FIG. 2, and also to unlock the patch panel 22. When unlocked, the assembly of the patch panel 22 and the spools 38, 40 can slide parallel to the cable deployment axis 50 to the extent permitted by a track slot 54 and one or more slot retainers 56, which engage the slot. The slot retainers 56 are coupled to the assembly such that when a slot retainer abuts a rear end stop 58 of the slot 54, the assembly cannot be moved further rearwards parallel to the cable deployment axis.

The cable 30 is wound in a plurality of windings 60 for storage within the housing 20. In this example, the windings 60 form figure 8 configurations about the spools 38, 40 when viewed along the fiber deployment axis 50. In other examples, the cable 30 can be wound in another winding configuration such as a loop around the two spools 38, 40.

In addition, some of the windings can be of one configuration (e.g., loops) and others of another configuration (e.g., figure 8's).

The cable 30 can be deployed to, e.g., make an active optical connection with the connector 34. The length of cable 30 that needs to be deployed to make that connection depends on the location of the desired connection relative to the back end (or deployment end) of the holder holding the cable 30. For example, a desired connection point may be close enough to the deployment end that only a small number (e.g., 5) of windings 60 need to be unwound from the spools 38, 40 in order for the connector 34 to reach the connection point with an appropriate amount of slack. Excess deployment can result in tangles in the cable or with other cables in the vicinity, damage to the cable, and so forth. In addition, the natural bend memory of the cable 30 can cause the cable to tend towards unwinding itself once the unwinding has begun (e.g., once the wrap 36 has been removed).

To minimize excess (i.e., unneeded) deployment of cable, retainers 70, 72 are provided at the deployment end of the cable holder. The retainers 70, 72 are resiliently flexible fingers. Each of the fingers 70, 72 is coupled at a fixed end 74, 76 of the finger 70, 72 to a spool, 38, 40. The fingers 70, 72 are coupled to the spools 38,40 at the rear ends (i.e., deployment ends) 46, 48 of the spools 38, 40. The fingers 70, 72 extend from their fixed ends 74, 76 to free ends 78, 80. Optionally, the free ends 78, 80 are positioned on tab portions 82, 84 of the fingers 70, 72. Optionally, the tab portions 82 and 84 nest with each other as shown in FIG. 1, with the fixed ends of the fingers being at opposite sides of their respective spools. Optionally, as shown, the fingers 70, 72 both cross (from opposite directions) a reference line 86. The reference line 86 is perpendicular to the deployment axis 50 and equidistant from the spool axes 42 and 44 (i.e., bisecting the space between the spools and intersecting a midpoint between the spools).

It should be appreciated that the deployment axis 50 represents an example overall or average direction of cable deployment, and is used herein as a reference axis for ease of description. In practice, a deployed length of cable can be represented by a deployment vector extending from the deployment end of the winding holder that will have a nonzero component that is parallel to the deployment axis 50, though it may also have another component that is perpendicular to the deployment axis 50.

The deployment axis 50 intersects a retention point 90 at which the fingers 70, 72 are positioned to contact the cable 30 as it is being deployed and apply a resistive force against the deployment. In particular, the retention point 90 is positioned centrally relative to the spools 38, 40 such that the retention point 90 contacts a crossover point of the figure 8 configuration of the windings 60. The fingers 70, 72 are configured such that the resistive force can be easily overcome by a pull force on the cable 30 (e.g., a pull force applied by a technician) that is of small enough magnitude not to damage the cable 30 or to damage the fingers 70, 72 or cause the fingers to decouple from the spools 38, 40. At the same time, the resistive force applied by the fingers 70, 72 is sufficient to prevent or at least reduce deployment through the retention point 90 due to natural bend memory tendencies in the wound cable. That is, the resistive force applied by the fingers 70, 72 is sufficient to prevent or at least reduce deployment of the cable caused by self-unwinding of the cable. When a pull force is applied on the cable 30 (e.g., by a technician) the windings 60 successively contact and cause the fingers at or around the retention point 90 to flex generally rearwards to open a gap between the fingers through which the cable can clear the fingers. Once the pulling force stops, the fingers 70, 72 are configured to resiliently return to their retaining position (e.g., as shown in FIG. 1).

In the example shown, the fixed ends 74, 76 of the fingers 72, 74 are not configured to be decoupled from, and recoupled to, the spools, 38, 40. For example, the fixed ends 74, 76 are fused to, attached with adhesive to, or integrally formed (e.g., molded) with, the spools 38, 40.

Figure 4:
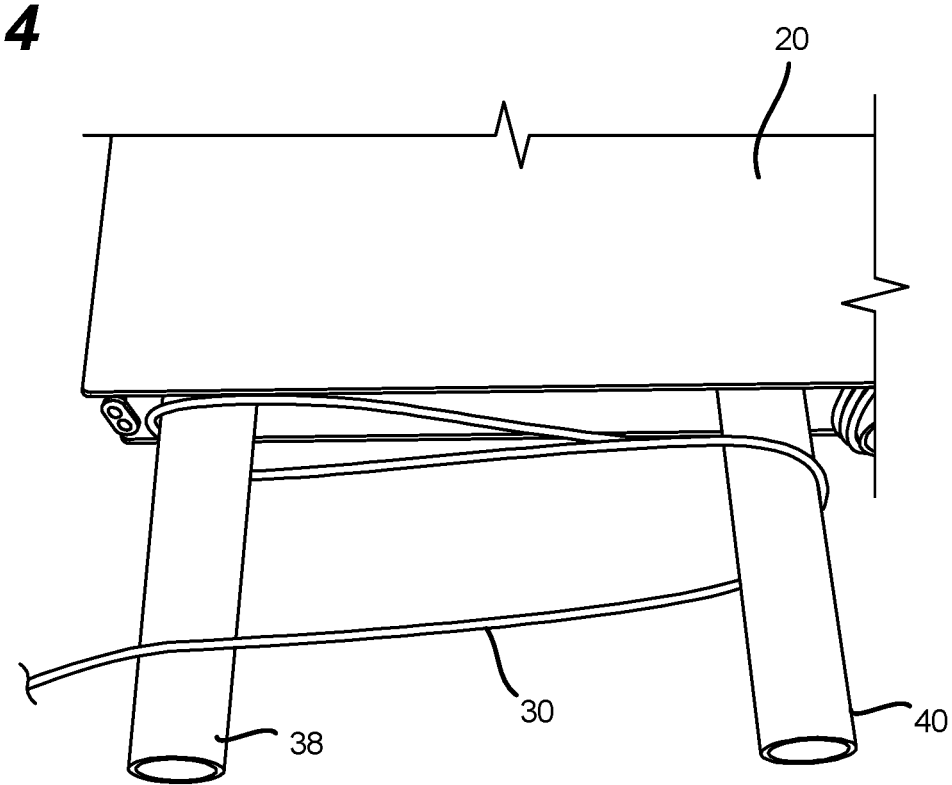
FIG. 4 is a rear perspective view of a portion of the telecommunications shelf of FIG. 1, showing a portion of a cable being wound on the first of the holders.

Alternatively, the fingers can be coupled to the spools 38, 40 such that they can be decoupled from the spools 38, 40 and recoupled to the spools 38, 40. Separate couplers can be used for this purpose, and/or the spools and/or fingers can be configured with coupling features. In some examples, decoupling of the fingers 70, 72 from the spools 38, 40 facilitates rewinding of the cable 30 on the spools. In FIG. 4, for example, the retainers have been decoupled from the spools 38, 40 to facilitate forming new figure 8 windings of the cable 30 about the spools 38, 40. Once the desired amount of rewinding is complete, the retainers can be recoupled to the spools 38, 40, and the spools and patch panel assembly slid back to the patch panel accessible configuration of FIG. 2. The patch panel 22 can then be locked in that configuration using the fastener 52.

It should be appreciated that the fingers 70, 72 can be used to control deployment of the cable 30 regardless of the position of the spools 38, 40 relative to the housing 20. In some examples, to help ensure the appropriate length of deployed cable for a desired active optical connection using the shelf 10, the cable 30 is deployed when the corresponding patch panel is in the patch panel accessible configuration as shown in FIG. 2, and the patch panel is only released and slid rearwards in order to re-wind the cable 30 about the spools.

Referring again to FIGS. 1-2, the housing 20 supports another assembly of patch panel 24 and spools 106 and 108 about which the cable 32 is wound in multiple figure 8 configured windings 110. The housing 20 defines a deployment end 112 for the assembly and a deployment axis 114. The patch panel 24 and spools 106, 108 can be slid relative to the housing 20 in the same manner as described above. The assembly of patch panel 24 and spools 106 and 108 differs from the other assembly of spools and patch panel of the shelf of FIG. 10 in the configuration and positioning of the retainers.

In this embodiment, the retainers 100 and 102 are coupled (optionally such that they are also decouplable and recouplable to facilitate re-winding of cable on the spools 106, 108) to the housing 20. The retainer 100 has a fixed end 120 fixed to a top panel 122 of the housing 20, and a free end 124, the retainer 100 extending downwards from its fixed end 120 towards its free end 124, optionally in a tapered fashion as shown. The retainer 102 has a fixed end 126 fixed to a bottom panel 128 of the housing 20, and a free end 130, the retainer 102 extending upwards from its fixed end 126 towards its free end 130, optionally in a tapered fashion as shown. Both retainers 100 and 102 cross a reference line 132 that bisects radial centers 134, 136, of the spools 106, 108, respectively. In some examples, the free ends include portions that nest with each other.

In the example shown, the FIGS. 100, 102 do not nest and separately define a pair of retention points 140, 142, at which the fingers 100, 102 are positioned to contact the cable 32 as it is being deployed and apply a resistive force against the deployment. In particular, the retention points 140, 142 are positioned to contact the windings 60 at or near the crossover point (e.g., on either side of the crossover point) of the figure 8 configuration of the windings 62 of the cable 32. The fingers 100, 102 are configured such that the resistive force can be easily overcome by a pull force on the cable 32 (e.g., a pull force applied by a technician) that is of small enough magnitude not to damage the cable 32 or to damage the fingers 100, 102 or cause the fingers to decouple from the housing 20. At the same time, the resistive force applied by the fingers 100, 102 is sufficient to prevent or at least reduce deployment through the retention points 140, 142 due to natural bend memory tendencies in the wound cable 32. That is, the resistive force applied by the fingers 100, 102 is sufficient to prevent or at least reduce deployment of the cable caused by self-unwinding of the cable. When a pull force is applied on the cable 32 (e.g., by a technician) the windings 62 successively contact and cause the fingers at or around the retention points 140, 142 to flex generally rearwards to open a gap between the fingers through which the cable can clear the fingers. Once the pulling force stops, the fingers 100, 102 are configured to resiliently return to their retaining position (e.g., as shown in FIG. 1).

In the example shown, the fixed ends 120, 126 of the fingers 100, 102 are not configured to be decoupled from and recoupled to the housing 20. For example, the fixed ends 120, 126 are fused to, attached with adhesive to, or integrally formed (e.g., molded) with, the housing 20.

Alternatively, the fingers 100, 102 can be coupled to the housing 20 such that they can be decoupled from the housing 20 and recoupled to the housing 20. Separate couplers can be used for this purpose, and/or the housing and/or fingers can be configured with coupling features. In some examples, decoupling of the fingers 100, 102 from the housing 20 facilitates rewinding of the cable 32 on the spools 106, 108. Once the desired amount of rewinding is complete, the retainers can be recoupled to the housing.

Figure 5:
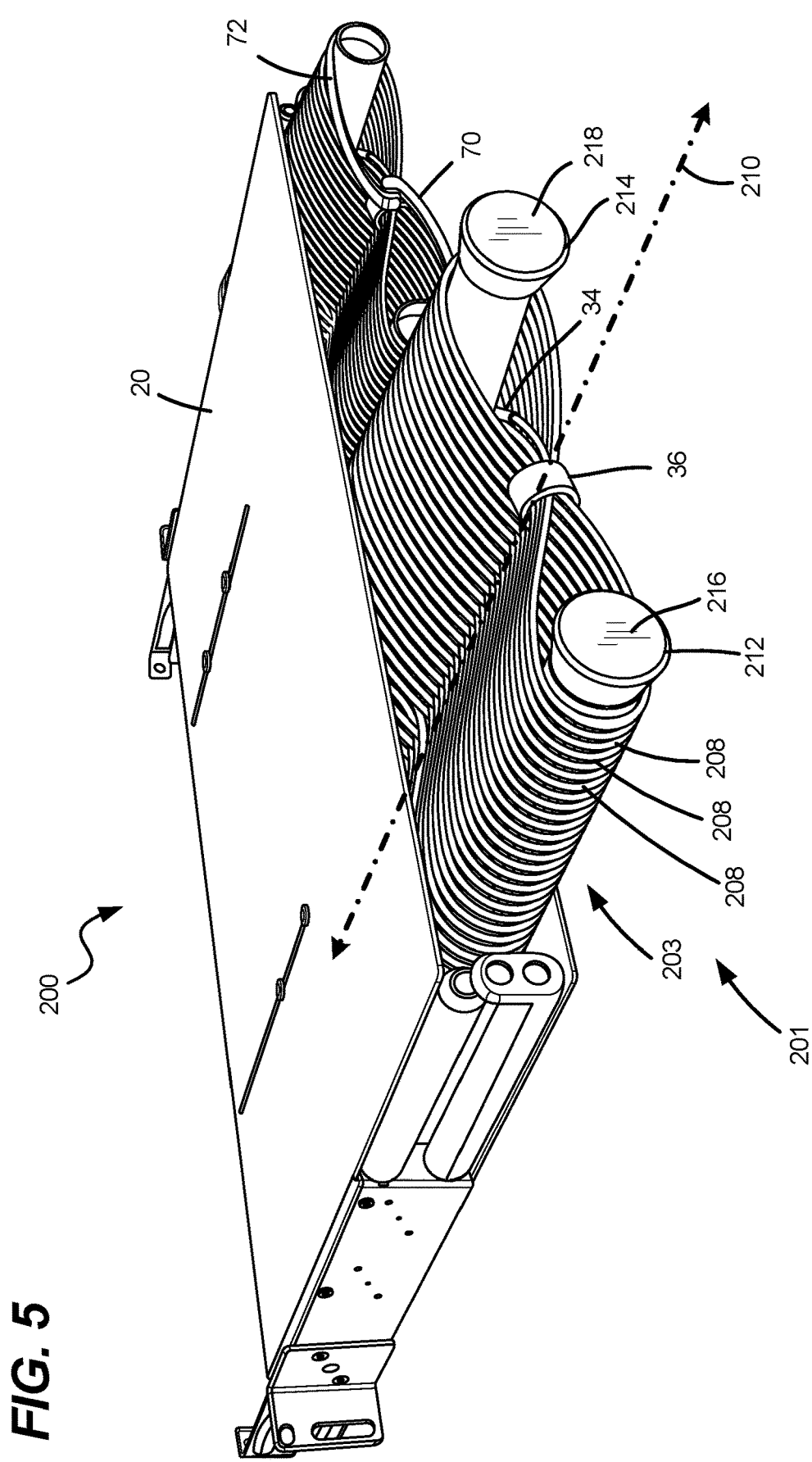
FIG. 5 is a rear perspective view of a further example telecommunications shelf including a further example cable winding holder.

Referring now to FIG. 5, in a further embodiment of a telecommunications shelf 200, a holder for cable windings 208 of a cable 203 includes the housing 20 and an assembly 201 that includes a pair of spaced apart spools 202 and 204 about which the cable 203 is wound. In this embodiment, the unwinding deployment control feature includes flared end portions 212, 214 of the spools 202 and 204. The flared end portions flare out radially towards the deployment ends 216, 218 of the spools 202, 204.

The flared portions 212, 214 are positioned to contact the cable 203 in multiple locations as it is being deployed along the deployment axis 210 and apply a resistive force against the deployment. In particular, the flared portions define retention points that are positioned to contact the windings 208 in the loop portions of the figure 8 configuration of the windings 208. The steepness of the flare is configured such that the resistive force can be easily overcome by a pull force on the cable 203 (e.g., a pull force applied by a technician) that is of small enough magnitude not to damage the cable 203 or to cause the flared portions to decouple from the housing spools 202, 204. At the same time, the resistive force applied by the flared portions 212, 214 is sufficient to prevent or at least reduce deployment through the retention points due to natural bend memory tendencies in the wound cable 203. That is, the resistive force applied by the flared portions 212, 214 is sufficient to prevent or at least reduce deployment of the cable caused by self-unwinding of the cable.

In some examples, the flared portions 212, 214 are configured to be decoupled from, and recoupled to, the spools 202, 204. In some examples, the flared portions 212, 214 are removable caps that cap the ends of the spools. In some examples, the flared portions 212, 214 are not configured to be decoupled from, and recoupled to, the spools 202, 204.

Having described the preferred aspects and embodiments of the present disclosure, modifications and equivalents of the disclosed concepts may readily occur to one skilled in the art. However, it is intended that such modifications and equivalents be included within the scope of the claims which are appended hereto.

What is claimed is:

1. A wound cable holder, comprising:
a holder body supporting a plurality of cable windings of a cable, the cable windings being positioned along a cable deployment axis defined by the holder body, the cable deployment axis defining a cable deployment direction, the holder body further defining a cable deployment end; and
a cable winding retainer positioned at the cable deployment end, the cable winding retainer being positioned and configured to successively contact the cable windings as the cable is deployed from the holder body and provide a resistive force against each successive cable winding in a direction that is opposite to the cable deployment direction,
wherein the holder body comprises a pair of spaced apart spools;
wherein the cable winding retainer crosses a midpoint between the two spools;
wherein the holder body includes a housing that houses the spools; and
wherein the cable winding retainer includes a pair of flexibly resilient fingers having fixed ends fixed to top and bottom panels of the housing.

2. The wound cable holder of claim 1, wherein the flexibly resilient fingers cross a reference line that intersects central axes of the spools and is perpendicular to the cable deployment axis.

3. The wound cable holder of claim 1, wherein the cable winding retainer includes flared end portions of the spools, the flared end portions flaring outward as the end portions approach the cable deployment end of the holder body.

4. The wound cable holder of claim 1, wherein the cable windings include figure 8 configurations, and wherein the cable winding retainer is positioned to contact a crossover point of the figure 8 configurations of successive windings as the cable is deployed from the holder body.

5. A wound cable holder, comprising:
a holder body supporting a plurality of cable windings of a cable, the cable windings being positioned along a cable deployment axis defined by the holder body, the cable deployment axis defining a cable deployment direction, the holder body further defining a cable deployment end; and
a cable winding retainer positioned at the cable deployment end, the cable winding retainer being positioned and configured to successively contact the cable windings as the cable is deployed from the holder body and provide a resistive force against each successive cable winding in a direction that is opposite to the cable deployment direction,
wherein the holder body comprises a pair of spaced apart spools;
wherein fixed ends of the flexibly resilient fingers are fixed to the spools;
wherein free ends of the flexibly resilient fingers include tabs that nest with each other; and wherein the flexibly resilient fingers cross a reference line that intersects a midpoint between the spools and is perpendicular to the cable deployment axis.

6. The wound cable holder of claim 5, wherein the cable winding retainer includes flared end portions of the spools, the flared end portions flaring outward as the end portions approach the cable deployment end of the holder body.

7. The wound cable holder of claim 5, wherein the cable windings include figure 8 configurations, and wherein the cable winding retainer is positioned to contact a crossover point of the figure 8 configurations of successive windings as the cable is deployed from the holder body.

8. A wound cable holder, comprising:
a housing;
a holder body defining a cable deployment end, the holder body including a pair of spaced apart spools supported within the housing, the spools having central axes that are parallel to a cable deployment axis defined by the holder body, the housing supporting the holder body and a patch panel of optical fiber adapters; and
a pair of cable winding retainers positioned at the cable deployment end and further positioned and configured to contact and apply a resistive force against a cable winding when a cable is deployed from the holder body,
wherein the cable winding retainers include a pair of flexibly resilient fingers having fixed ends fixed to top and bottom panels of the housing; and
wherein the flexibility resilient fingers cross a reference line that intersects the central axes of the spools and is perpendicular to the cable deployment axis.

9. The wound cable holder of claim 8, wherein the patch panel and the spools are operatively coupled together and slidable together relative to the housing.

10. The wound cable holder of claim 9, wherein the cable deployment end coincides with ends of the spools such that the cable deployment end is movable relative to the housing.

11. The wound cable holder of claim 9, wherein the cable deployment end is defined by an end of the housing such that the cable deployment end is not movable relative to the housing.

12. The wound cable holder of claim 8, wherein the cable winding retainers cross a midpoint between the two spools.

13. The wound cable holder of claim 8, wherein the cable winding retainers include a pair of flexibly resilient fingers.

14. The wound cable holder of claim 13, wherein fixed ends of the flexibly resilient fingers are fixed to the spools.

15. The wound cable holder of claim 8, further including a cable,
wherein the cable includes a connector inserted in one of the adapters of the patch panel; and
wherein the cable is wound around the spools in windings having figure 8 configurations, and wherein the cable winding retainers are positioned to contact a crossover point of the figure 8 configurations of successive windings as the cable is deployed from the holder body.

16. A wound cable holder, comprising:
a housing;
a holder body defining a cable deployment end, the holder body including a pair of spaced apart spools supported within the housing, the spools having central axes that are parallel to a cable deployment axis defined by the holder body, the housing supporting the holder body and a patch panel of optical fiber adapters; and
a pair of cable winding retainers positioned at the cable deployment end and further positioned and configured to contact and apply a resistive force against a cable winding when a cable is deployed from the holder body,
wherein the cable winding retainers include a pair of flexibly resilient fingers;
wherein fixed ends of the flexibly resilient fingers are fixed to the spools;
wherein free ends of the flexibly resilient fingers include tabs that nest with each other; and
wherein the fingers cross a reference line that intersects a midpoint between the spools and is perpendicular to the cable deployment axis.

17. The wound cable holder of claim 16, further including a cable,
wherein the cable includes a connector inserted in one of the adapters of the patch panel; and
wherein the cable is wound around the spools in windings having figure 8 configurations, and wherein the cable winding retainers are positioned to contact a crossover point of the figure 8 configurations of successive windings as the cable is deployed from the holder body.

\* \* \* \* \*